(12) United States Patent
Miyano et al.

(10) Patent No.: US 8,993,415 B2
(45) Date of Patent: Mar. 31, 2015

(54) SEMICONDUCTOR DEVICE AND MANUFACTURING METHOD THEREOF

(75) Inventors: Kiyotaka Miyano, Tokyo (JP); Toshitaka Miyata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 13/548,653

(22) Filed: Jul. 13, 2012

(65) Prior Publication Data

US 2013/0075830 A1 Mar. 28, 2013

(30) Foreign Application Priority Data

Sep. 26, 2011 (JP) ................................. 2011-208913

(51) Int. Cl.

| H01L 21/322 | (2006.01) |
|---|---|
| H01L 29/66 | (2006.01) |
| H01L 29/739 | (2006.01) |
| H01L 29/165 | (2006.01) |
| H01L 21/265 | (2006.01) |
| H01L 21/324 | (2006.01) |

(52) U.S. Cl.

CPC ...... H01L 29/66356 (2013.01); H01L 29/7391 (2013.01); H01L 29/165 (2013.01); H01L 21/26506 (2013.01); H01L 21/324 (2013.01)

USPC ........... 438/473; 438/285; 438/482; 438/486; 438/514; 257/E21.316

(58) Field of Classification Search

CPC ............ H01L 21/26506; H01L 21/324; H01L 29/165; H01L 29/7391; H01L 29/66356; H01L 29/6659; H01L 21/823807; H01L 29/7848; H01L 29/665; H01L 21/823814; H01L 21/26513; H01L 29/66636

USPC .......................... 438/285, 473, 486, 482, 514; 257/E21.316

See application file for complete search history.

(56) References Cited

U.S. PATENT DOCUMENTS 5,969,407 A * 10/1999 Gardner et al. ............... 257/607
6,172,399 B1 1/2001 Lee et al.
(Continued)

FOREIGN PATENT DOCUMENTS

| JP | 7-28034 | 3/1995 |
|---|---|---|
| JP | 10-189473 | 7/1998 |

(Continued)

*Primary Examiner* — Michelle Mandala
(74) *Attorney, Agent, or Firm* — Finnegan, Henderson, Farabow, Garrett & Dunner, L.L.P.

(57) ABSTRACT

In a method, a gate dielectric film is formed on a semiconductor substrate. A gate electrode is formed on the gate dielectric film. Impurities of a first conduction-type are introduced into a drain-layer formation region. The impurities of the first conduction-type in the drain-layer formation region are activated by performing heat treatment. Single crystals of the semiconductor substrate in a source-layer formation region are amorphized by introducing inert impurities into the source-layer formation region. Impurities of a second conduction-type is introduced into the source-layer formation region. At least an amorphous semiconductor in the source-layer formation region is brought into a single crystal semiconductor and the impurities of the second conduction-type in the source-layer formation region is activated by irradiating the semiconductor substrate with microwaves. The impurities of the second conduction-type in the source-layer formation region is shallower than the impurities of the first conduction-type in the drain-layer formation region.

18 Claims, 7 Drawing Sheets

(56) References Cited

U.S. PATENT DOCUMENTS

| | | |
|---|---|---|
| 2007/0029577 A1 | 2/2007 | Kinoshita et al. |
| 2007/0167029 A1 | 7/2007 | Kowalski et al. |
| 2009/0034355 A1 | 2/2009 | Wang et al. |
| 2011/0076842 A1 | 3/2011 | Yoshino et al. |
| 2011/0186925 A1 | 8/2011 | Miyata |

FOREIGN PATENT DOCUMENTS

| | | |
|---|---|---|
| JP | 11-017184 | 1/1999 |
| JP | 11-251582 | 9/1999 |
| JP | 2004-014941 | 1/2004 |
| JP | 2006-147861 | 6/2006 |
| JP | 2007-042802 | 2/2007 |
| JP | 2009-516375 | 4/2009 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2011-208913, filed on Sep. 26, 2011, the entire contents of which are incorporated herein by reference.

FIELD

The embodiments of the present invention relate to a semiconductor device and manufacturing method thereof.

BACKGROUND

A tunnel field-effect transistor (TFET) has been developed as a successor to a metal-oxide semiconductor FET (MOSFET). The TFET enables a gate voltage to narrow an energy barrier on interface between a source and a channel and applies a current by means of band-to-band tunneling. At this time, an on-state current ion decreases when the resistance of a band between the source and the channel is high.

To deal with this problem, it is considered to previously form a narrow energy barrier between the source and the channel by setting a steep concentration gradient of a junction between the source and the channel. However, if the concentration gradient of the junction between the source and the channel is steep, the concentration gradient of a junction between a drain and the channel also inevitably becomes steep. If the concentration gradients of the junction between the source and the channel and of that between the drain and the channel are both steep, an off-leakage current increases due to occurrence of band-to-band tunneling when the TFET is off.

It is necessary to set a gentle concentration gradient of the junction between the source and the channel while setting a steep concentration gradient between the source and the channel to suppress the off-leakage current with keeping the on-state current high. However, it is difficult to form the TFET in such a manner that the concentration gradient in the source is asymmetric to that in the drain.

DETAILED DESCRIPTION

In a method of manufacturing a semiconductor device according to the present embodiment, a gate dielectric film is formed on a semiconductor substrate. A gate electrode is then formed on the gate dielectric film. Impurities of a first conduction type are then introduced into a drain-layer formation region. The impurities of the first conduction type in the drain-layer formation region are then activated by performing heat treatment. Single crystals of the semiconductor substrate in a source-layer formation region are then amorphized by introducing inert impurities into the source-layer formation region. Impurities of a second conduction type are then introduced into the source-layer formation region. At least an amorphous semiconductor in the source-layer formation region is then brought into a single crystal semiconductor and the impurities of the second conduction type in the source-layer formation region are activated by irradiating the semiconductor substrate with microwaves. The impurities of the second conduction type in the source-layer formation region are shallower than the impurities of the first conduction type in the drain-layer formation region.

Embodiments will now be explained with reference to the accompanying drawings. The present invention is not limited to the embodiments.

First Embodiment

Figure 4:
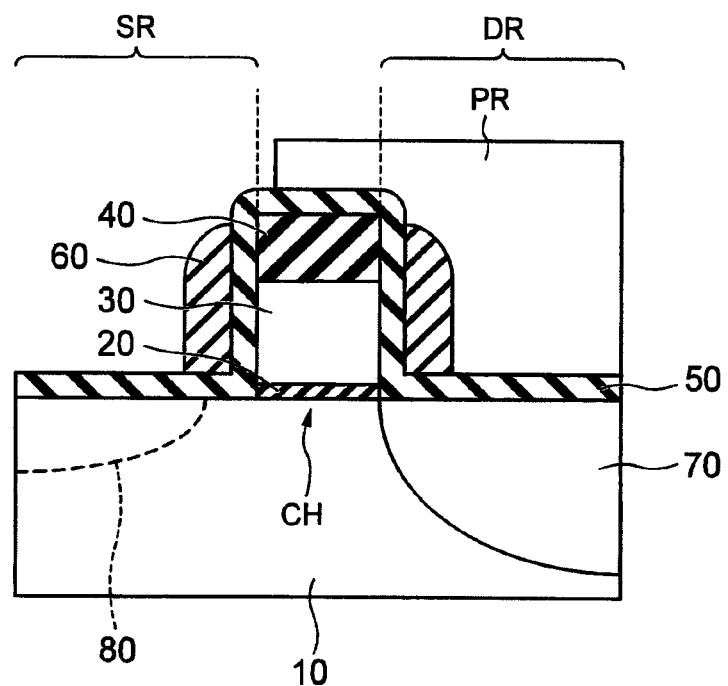
Figure 5:
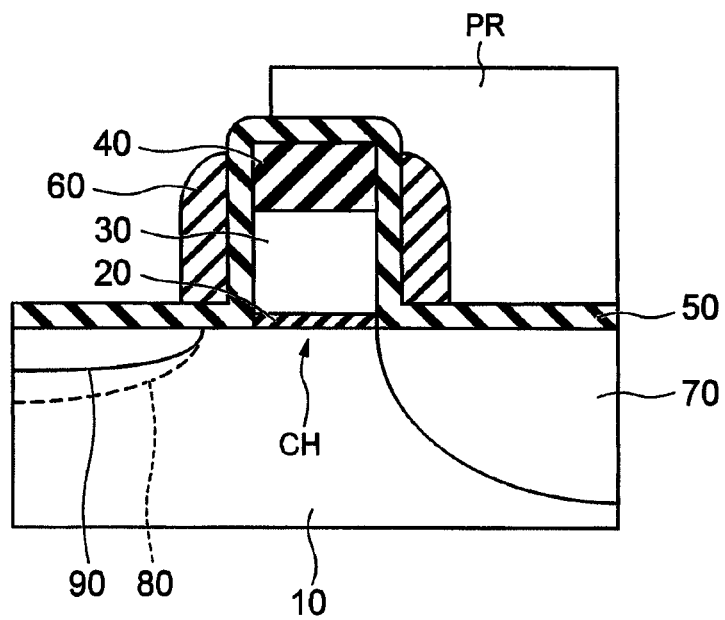
Figure 6:
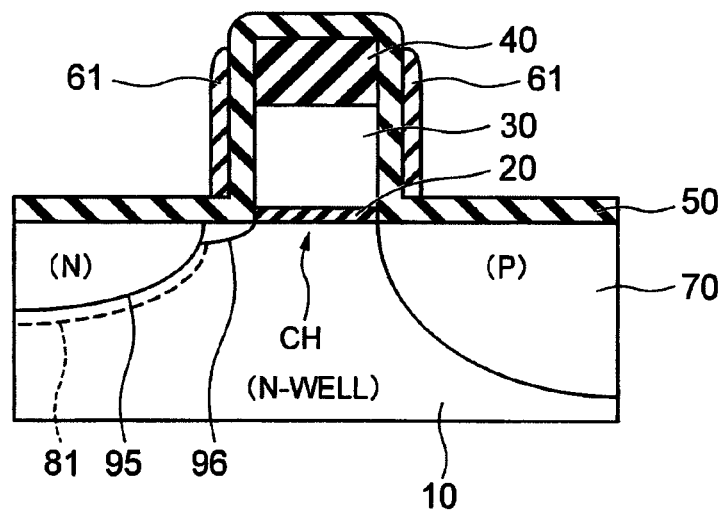

FIGS. 1 to 6 are cross-sectional views showing a method of manufacturing a P-type TFET according to a first embodiment. FIG. 6 also shows a configuration of the TFET according to the first embodiment. A method of manufacturing an N-type TFET is not described herein because the method can be easily understood by referring to the method of manufacturing the P-type TFET.

Figure 1:
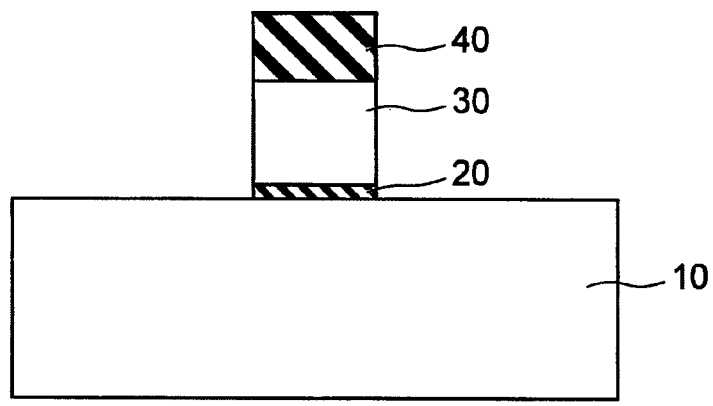
FIGS. 1 to 6 are cross-sectional views showing a method of manufacturing a P-type TFET according to a first embodiment.

As shown in FIG. 1, a silicon substrate 10 serving as a semiconductor substrate is prepared first. After forming a sacrificial oxide film (not shown) on the silicon substrate 10, an impurity is implanted for formation of an N-well and a channel. The silicon substrate 10 is then subjected to heat treatment, thereby forming the N-well and the channel.

Next, a gate dielectric film 20 is formed on the N-well of the silicon substrate 10. For example, the gate dielectric film 20 is formed by using a silicon oxide film or a high dielectric material higher in a dielectric constant than the silicon oxide film. Next, a material of a gate electrode 30 is deposited on the gate dielectric film 20, and a mask material 40 is deposited on the gate electrode 30. The material of the gate electrode 30 is formed by using doped polysilicon, for example. The mask material 40 is formed by using a silicon oxide film or a silicon nitride film, for example.

Next, the mask material 40 is processed into a pattern of the gate electrode 30 by a lithography technique and an RIE (Reactive Ion Etching) method. Using the processed mask material 40 as a mask, the material of the gate electrode 30 is etched by the RIE method. The configuration shown in FIG. 1 is thereby obtained.

Figure 2:
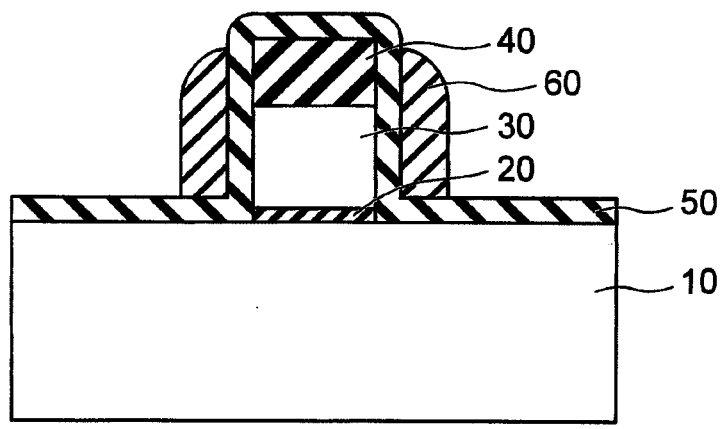

Next, as shown in FIG. 2, a liner layer 50 is deposited so as to cover the silicon substrate 10, the mask material 40, and the gate electrode 30 with the liner layer 50. The liner layer 50 is formed by using an insulating film such as a silicon nitride film or a silicon oxide film.

A material of a sidewall film 60 is deposited on the liner layer 50 and the sidewall film 60 is etched back. The sidewall film 60 is thereby left on a side surface of the gate electrode 30. The material of the sidewall film 60 is formed by using an insulating film such as a silicon oxide film or a silicon nitride film.

Figure 3:
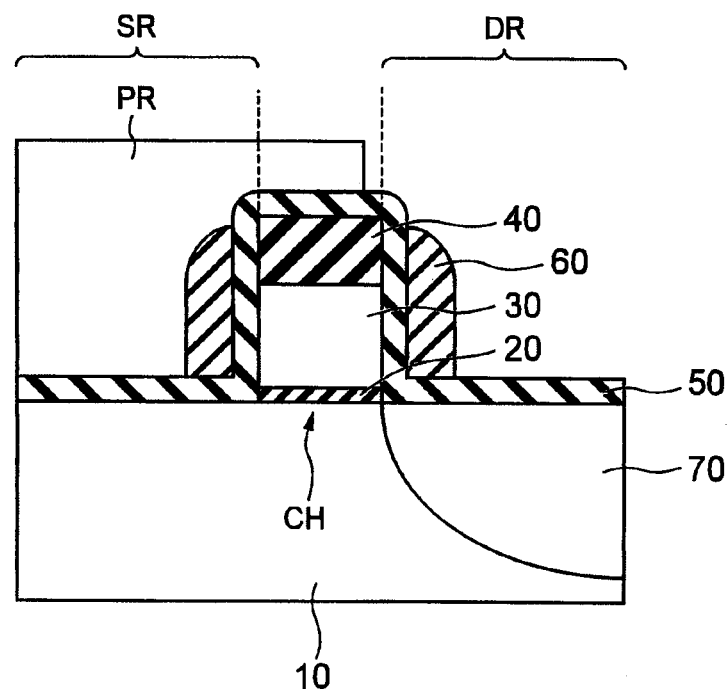

As shown in FIG. 3, a source-layer formation region SR is covered with a photoresist PR and a drain-layer formation region DR is opened, by the lithography technique. A P-type impurity is then implanted into the drain-layer formation region DR as an impurity of a first conduction type. For example, boron ($B^+$) is used as the P-type impurity. For example, the implantation condition is such that boron ions at a concentration of 2E15 cm$^{-2}$ are implanted at an energy of 8 keV. This impurity is diffused and activated by an RTA (Rapid Thermal Anneal) method or the like. A drain layer 70 shown in FIG. 3 is thereby formed. At this time, for example, the RTA is performed at a temperature of about 1000 degrees for about 10 seconds. In this way, the drain layer 70 is formed by high-temperature annealing as per normal. The drain layer 70 is thereby diffused deeply (widely), so that a concentration gradient (a concentration profile) between the drain layer 70 and a channel region CH becomes relatively gentle.

The photoresist PR covering the source-layer formation region SR is then removed. Next, as shown in FIG. 4, the drain-layer formation region DR is covered with a photoresist PR and the source-layer formation region SR is opened, by the lithography technique. An inert impurity is implanted into the source-layer formation region SR, thereby amorphizing the silicon substrate 10 (single crystal silicon) in the source-layer formation region SR. As the inert impurity, an inert material (the Group 14 element) such as silicon that is a material of the silicon substrate 10, germanium larger than silicon, or a germanium-silicon compound ($Si_{1-x}Ge_x$ (X=0 to 1)) is used. The inert impurity has no influence on a source layer 95 (see FIG. 6) to be formed later because of the inertial characteristics. In the first embodiment, germanium is used as the inert impurity. The silicon substrate 10 in the source-layer formation region SR is amorphized by implanting germanium ($Ge^+$) ions at an energy of about 15 keV at a concentration of about 2E15 cm$^{-2}$, for example. As shown in FIG. 4, an amorphous silicon layer 80 is thereby formed in the silicon substrate 10 in the source-layer formation region SR. Because germanium is an atom larger than boron or silicon, the germanium ions reach only a shallower position than that of the drain layer 70 even if being implanted at an energy of 10 keV. That is, the source-layer formation region SR is amorphized only to the shallower position than that of the drain layer 70 and the amorphous silicon layer 80 is, therefore, shallower than the drain layer 70.

Next, an N-type impurity is implanted into the source-layer formation region SR as an impurity of a second conduction type. For example, arsenic ($As^+$) is used as the N-type impurity. For example, the implantation condition is such that arsenic ions at a concentration of 2E15 cm$^{-2}$ are implanted at an energy of 15 keV. An impurity layer 90 is thereby formed within the amorphous silicon layer 80 as shown in FIG. 5. Note that arsenic is implanted shallower than germanium ions serving as the inert impurity. That is, the impurity layer 90 is formed shallower than the amorphous silicon layer 80. The impurity layer 90 can be thereby activated entirely at a microwave annealing step to be described later.

To form an extension layer 96, the photoresist PR and the sidewall film 60 are removed and TEOS (Tetraethoxysilane) film thinner than the sidewall film 60 is deposited. This TEOS film is etched back, thereby leaving a second sidewall film 61 thinner than the sidewall film 60 on the side surface of the gate electrode 30. Next, the drain-layer formation region DR is covered again with a photoresist PR and the source-layer formation region SR is opened again, by the lithography technique. An N-type impurity is further implanted into the source-layer formation region SR. For example, arsenic ($As^+$) is used as the N-type impurity. For example, the implantation condition is such that arsenic ions at a concentration of 1.8E15 cm$^{-2}$ are implanted at an energy of 7 keV. The impurity is thereby implanted shallower than the impurity layer 90. In this case, the extension layer 96 is not necessarily formed.

After removing the photoresist PR, microwave annealing is performed.

An annealing step in a process of manufacturing a semiconductor device is as indispensable to improving the crystallinity of the semiconductor device, activating dopants, and the like as before. The annealing step has been regarded as an important technique in the semiconductor industry.

However, long-time annealing disadvantageously degrades the concentration profile of the impurity and deviates various interface (or junction) characteristics from designed values. This is why the RTA method or the like is recently used as an annealing method that can perform annealing at a very high temperature in a short time. The annealing method at such a high temperature in such a short time can improve the crystallinity and activate dopants while suppressing defects that accompany the long-time annealing.

Meanwhile, such high-temperature annealing cannot be performed locally only on a part of the semiconductor substrate, resulting in the equal diffusion of both the source and the drain. That is, it is difficult to create asymmetric concentration gradients (concentration profiles) in the source and drain by the high-temperature annealing.

Therefore, in the first embodiment the microwave annealing is performed at a step of forming the source layer 95 that needs a steep concentration gradient. The microwave annealing can sufficiently improve the crystallinity and activate the impurity even at a low temperature (200 degrees to 550 degrees).

Microwaves are absorbed efficiently by an amorphized material and not so much by a single crystal material due to the characteristics of the microwaves. Accordingly, the microwaves are absorbed by the amorphous silicon layer 80 in the source-layer formation region SR with high efficiency. The temperature of the amorphous silicon layer 80 in the source-layer formation region SR thereby rises to some extent. On the other hand, the microwaves are not so absorbed by the drain-layer formation region DR and do not have a great influence on the drain layer 70.

Therefore, the irradiation of the microwaves onto the silicon substrate 10 can anneal the source-layer formation region SR at a low temperature without influencing the drain-layer formation region DR. The irradiation of the microwaves onto the silicon substrate 10 recrystallizes the amorphous silicon layer 80, and activates the impurity used for the impurity layer 90 and that for the extension layer 96 without large diffusion. As shown in FIG. 6, the source layer 95 and the extension layer 96 are thereby formed. Note that the germanium layer 81 is still located at a deeper position than that of the source layer 95 because the microwaves anneal the source layer 95 at a low temperature.

The source layer 95 and the extension layer 96 are formed shallower than the drain layer 70. That is, the impurity of the source layer 95 is shallower than that of the drain layer 70. The source layer 95 and the extension layer 96 have thereby steeper impurity concentration gradients than that of the drain layer 70, while the drain layer 70 has a gentler impurity concentration than those of the source layer 95 and the extension layer 96.

Next, an interlayer dielectric film, contacts, metal wirings, and the like (all of which are not shown) are formed, thereby completing the P-type TFET according to the first embodiment. To form an N-type TFET, it suffices to apply conduction types of impurities implanted into the well, the channel region, the source layer, the drain layer, and the like opposite to those of the P-type TFET.

Figure 7A:
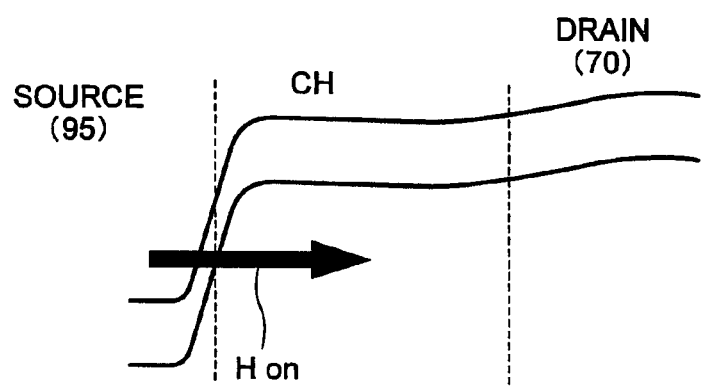
FIGS. 7A and 7B are energy band diagrams showing an operation performed by the P-type TFET according to the first embodiment.
Figure 7B:
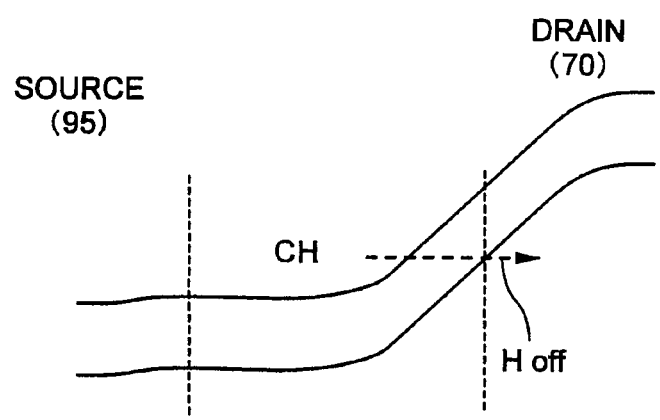

FIGS. 7A and 7B are energy band diagrams showing an operation performed by the P-type TFET according to the first embodiment. FIG. 7A is an energy band diagram when the P-type TFET is in an ON-state, and FIG. 7B is an energy band diagram when the P-type TFET is in an OFF-state.

When a positive voltage is applied to the gate electrode 30, an energy barrier between the source layer 95 and the channel region CH narrows as shown in FIG. 7A. Positive holes Hon thereby tunnel from a conduction band of the source layer 95 into a valence band of the channel region CH, as indicated by an arrow of FIG. 7A. In the first embodiment, the impurity concentration gradient between the source layer 95 and the channel region CH is steep. Therefore, an ON-resistance of the P-type TFET is low and a high on-state current Ion flows (many positive holes Hon flow).

When the application of the voltage to the gate electrode 30 stops, an energy barrier between the drain layer 70 and the channel region CH becomes slightly narrower, as shown in FIG. 7B. However, in the first embodiment, tunneling of positive holes Hoff (an off-leakage current) as indicated by an arrow of FIG. 7B is suppressed because the impurity concentration gradient is gentle between the drain layer 70 and the channel region CH.

Figure 8A:
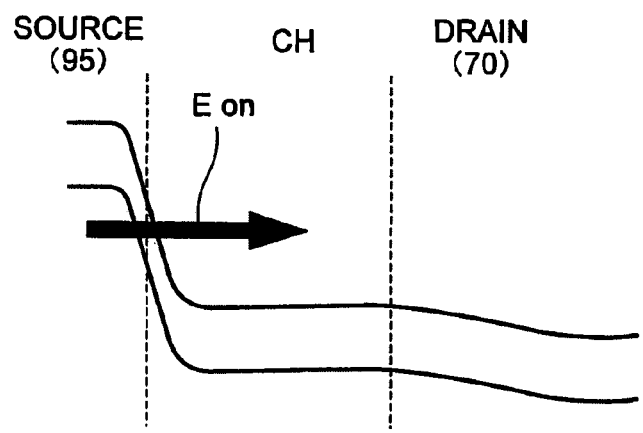
FIGS. 8A and 8B are energy band diagrams showing an operation performed by the N-type TFET according to the first embodiment.
Figure 8B:
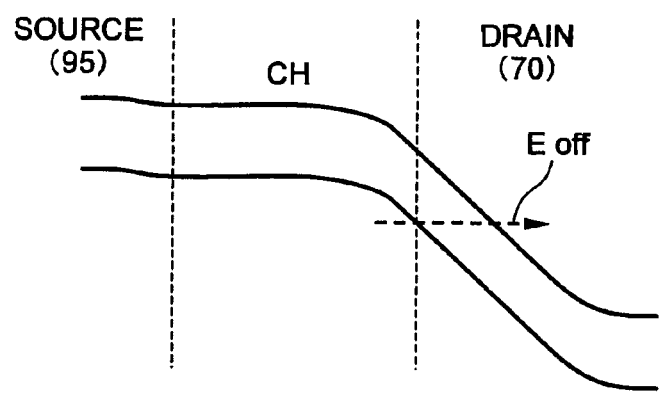

FIGS. 8A and 8B are energy band diagrams showing an operation performed by the N-type TFET according to the first embodiment. FIG. 8A is an energy band diagram when the N-type TFET is in an ON-state and FIG. 8B is an energy band diagram when the N-type TFET is in an OFF-state.

When a negative voltage is applied to the gate electrode 30, an energy barrier between the source layer 95 and the channel region CH narrows as shown in FIG. 8A. Electrons Eon thereby tunnel from a valence band of the source layer 95 into a conduction band of the channel region CH, as indicated by an arrow of FIG. 8A. In the first embodiment, the impurity concentration gradient between the source layer 95 and the channel region CH is steep. Therefore, an ON-resistance is low and a high on-state current Ion flows (many electrons Eon flow).

When the application of the voltage to the gate electrode 30 stops, an energy barrier between the drain layer 70 and the channel region CH becomes slightly narrower, as shown in FIG. 8B. However, in the first embodiment, tunneling of electrons Eoff (an off-leakage current) as indicated by an arrow of FIG. 8B is suppressed because the impurity concentration gradient is gentle between the drain layer 70 and the channel region CH.

The configuration of the P-type TFET according to the first embodiment is described next. As shown in FIG. 6, the P-type TFET according to the first embodiment includes the silicon substrate 10 serving as the semiconductor substrate. The P-type drain layer 70 is provided on a surface of the silicon substrate 10. The N-type source layer 95 is provided on the surface of the silicon substrate 10. The gate dielectric film 20 is provided on the surface of the silicon substrate 10 between the source layer 95 and the drain layer 70. The gate electrode 30 is provided on the gate dielectric film 20. The drain layer 70 is deeper than the source layer 95. The impurity concentration change from the channel region CH under the gate electrode 30 to the source layer 95 is steeper (or sharper) than that from the channel region CH to the drain layer 70. The source layer 95 contains germanium as the inert impurity. It suffices to configure the N-type TFET according to the first embodiment in such a manner that an N-type drain layer is provided instead of the P-type drain layer 70 of the P-type TFET and that a P-type source layer is provided instead of the N-type source layer 95 thereof.

In the TFET according to the first embodiment, the impurity concentration gradient between the source layer 95 and the channel region CH is steep and that between the drain layer 70 and the channel region CH is gentle. Therefore, the TFET according to the first embodiment can suppress the off-leakage current while ensuring a high on-state current.

According to the manufacturing method of the first embodiment, the TFET in which the impurity concentration gradient between the source layer 95 and the channel region CH is steep and that between the drain layer 70 and the channel region CH is gentle can be easily formed. That is, the impurity concentration profiles of the source layer 95 and the drain layer 70 can be individually controlled by introducing the microwave annealing into the step of forming the diffusion layers of the TFET. Therefore, the manufacturing method according to the first embodiment can easily manufacture the TFET capable of suppressing the off-leakage current while ensuring the high on-state current.

Second Embodiment

FIGS. 9 to 12 are cross-sectional views showing a method of manufacturing a TFET according to a second embodiment.

Figure 9:
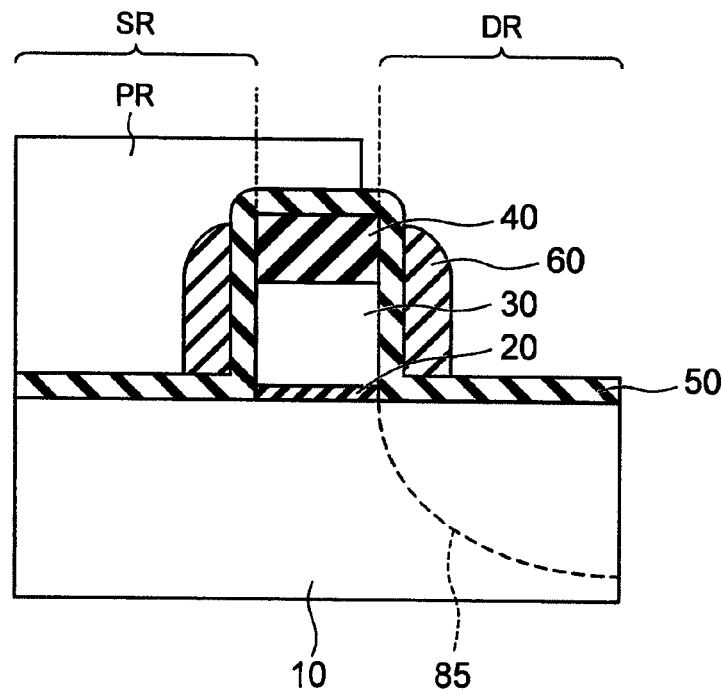
FIGS. 9 to 12 are cross-sectional views showing a method of manufacturing a TFET according to a second embodiment.

Subsequent to the steps described above with reference to FIGS. 1 and 2, the source-layer formation region SR is covered with a photoresist PR and the drain-layer formation region DR is opened, by the lithography technique as shown in FIG. 9. Next, an inert impurity is implanted into the drain-layer formation region DR, thereby amorphizing the silicon substrate 10 (single crystal silicon) in the drain-layer formation region DR. As the inert impurity, an inert material (the Group 14 element) such as silicon that is the material of the silicon substrate 10, germanium larger than silicon, or the germanium-silicon compound ($Si_{1-x}Ge_x$ (X=0 to 1)) is used. In the second embodiment, germanium is used as the inert impurity. The silicon substrate 10 in the drain-layer formation region DR is amorphized by implanting germanium ($Ge^+$) ions at an energy of about 30 keV at a concentration of about $2E15\ cm^{-2}$, for example. As shown in FIG. 9, an amorphous silicon layer 85 is thereby formed.

Figure 10:
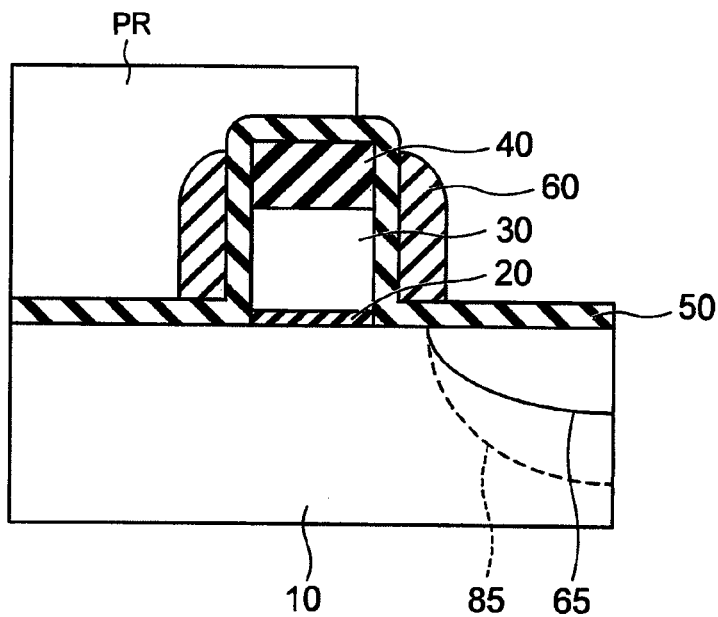

Next, a P-type impurity is implanted into the drain-layer formation region DR as an impurity of the first conduction type. For example, boron ($B^+$) is used as the P-type impurity. For example, the implantation condition is such that boron ions at a concentration of $2E15\ cm^{-2}$ are implanted at an energy of 8 key. An impurity layer 65 is thereby formed within the amorphous silicon layer 85 as shown in FIG. 10. Note that the P-type impurity is implanted shallower than germanium ions serving as the inert impurity. That is, the impurity layer 65 is formed shallower than the amorphous silicon layer 85. The impurity layer 65 can be thereby activated entirely at a microwave annealing step to be described later.

Figure 11:
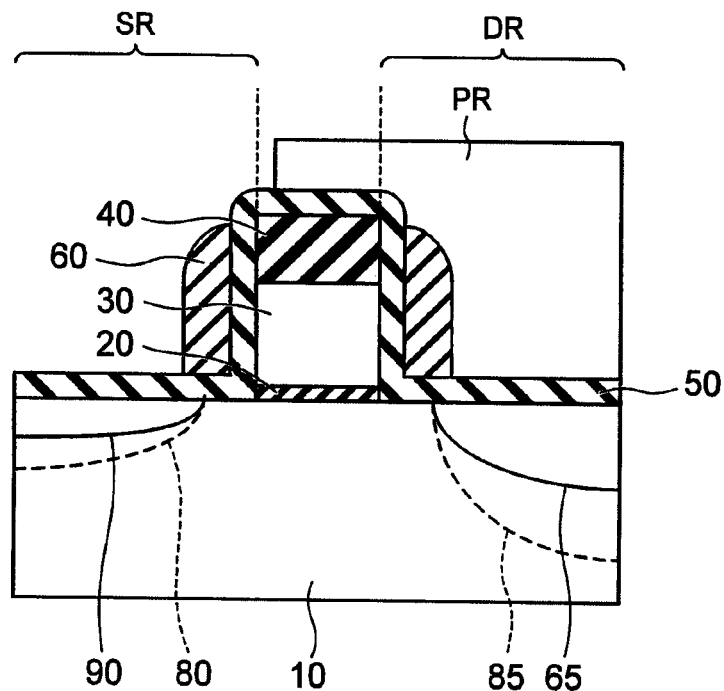

Next, the photoresist PR covering the source-layer formation region SR is removed. Next, as shown in FIG. 11, the drain-layer formation region DR is covered with a photoresist PR and the source-layer formation region SR is opened, by the lithography technique. As described with reference to FIG. 5, germanium is implanted into the source-layer formation region SR, thereby amorphizing the silicon substrate 10 (single crystal silicon) in the source-layer formation region SR. As shown in FIG. 11, the amorphous silicon layer 80 is thereby formed in the silicon substrate 10 in the source-layer formation region SR.

At this time, germanium is implanted shallower in the source-layer formation region SR than in the drain-layer formation region DR. The silicon substrate 10 in the source-layer formation region SR is amorphized by implanting germanium ($Ge^+$) ions at an energy of about 10 keV at a concentration of about $2E15\ cm^{-2}$, for example. The germanium implantation energy during the formation of the amorphous silicon layer 80 is lower than that during the formation of the amorphous silicon layer 85. The amorphous silicon layer 80 in the source-layer formation region SR is formed shallower than the amorphous silicon layer 85 in the drain-layer formation region DR.

Next, as described with reference to FIG. 5, an N-type impurity is implanted into the source-layer formation region SR as an impurity of the second conduction type. For example, arsenic (As$^+$) is used as the N-type impurity. For example, the implantation condition is such that arsenic ions at a concentration of 2E15 cm$^{-2}$ are implanted at an energy of 20 keV. The impurity layer 90 is thereby formed within the amorphous silicon layer 80 as shown in FIG. 11. The N-type impurity is implanted shallower than germanium ions serving as the inert impurity. That is, the impurity layer 90 is formed shallower than the amorphous silicon layer 80. The impurity layer 90 can be thereby entirely activated at the microwave annealing step to be described later.

To form the extension layer 96, the photoresist PR and the sidewall film 60 are removed and TEOS thinner than the sidewall film 60 is deposited. This TEOS is etched back, thereby leaving the second sidewall film 61 thinner than the sidewall film 60 on the side surface of the gate electrode 30. Next, the drain-layer formation region DR is covered again with a photoresist PR and the source-layer formation region SR is opened again, by the lithography technique. An N-type Impurity is further implanted into the source-layer formation region SR. For example, arsenic (As$^+$) is used as the N-type impurity. For example, the implantation condition is such that arsenic ions at a concentration of 1E15 cm$^{-2}$ are implanted at an energy of 10 key. The impurity is thereby implanted shallower than that of the impurity layer 90.

After removing the photoresist PR, microwave annealing is performed. The amorphous silicon layers 80 and 85 are formed in the source-layer formation region SR and the drain-layer formation region DR, respectively. The irradiation of the microwaves onto the silicon substrate 10 can thereby bring simultaneously and collectively the amorphous silicon layers 80 and 85 into single-crystallized layers, and can thereby simultaneously and collectively activate the P-type impurity in the drain-layer formation region DR and the N-type impurity in the source-layer formation region SR.

Figure 12:
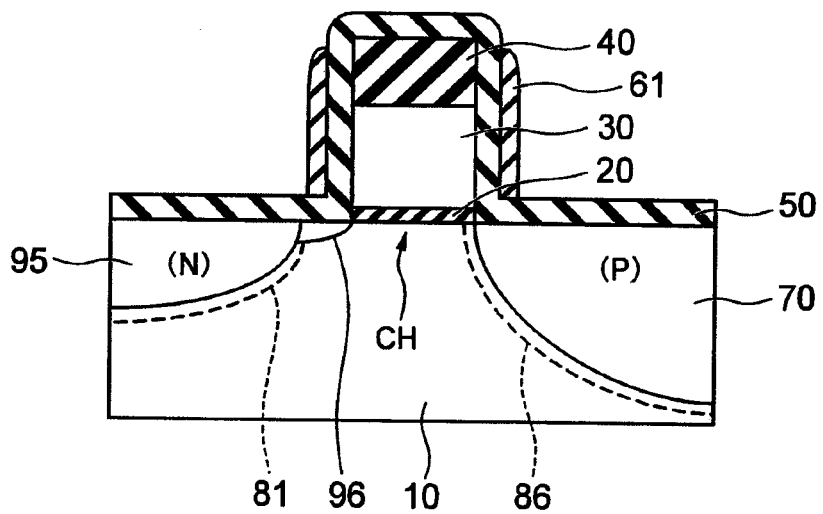

At this time, the amorphous silicon layer 85 in the drain-layer formation region DR is formed deeper than the amorphous silicon layer 80 in the source-layer formation region SR. The drain-layer formation region DR is annealed at a higher temperature than the source-layer formation region SR because the microwaves are efficiently absorbed by amorphous silicon as described above. Therefore, as shown in FIG. 12, the impurity (boron) is diffused in the drain-layer formation region DR deeper (more widely) than the impurity (arsenic) in the source-layer formation region SR. As a result, the source layer 95 and the extension layer 96 have steeper impurity concentration gradients than that of the drain layer 70, while the drain layer 70 has a gentler impurity concentration gradient than those of the source layer 95 and the extension layer 96.

Next, an interlayer dielectric film, contacts, metal wirings, and the like (all of which are not shown) are formed, thereby completing the P-type TFET according to the second embodiment. To form an N-type TFET, it suffices to apply conduction types of impurities implanted into the well, the channel region, the source layer, the drain layer, and the like opposite to those of the P-type TFET.

The germanium layer 81 is still located at a deeper position than that of the source layer 95 because the microwaves anneal the source layer 95 at a low temperature. Furthermore, a germanium layer 86 can be also located at a deeper position than that of the drain layer 70.

Operations performed by the TFET according to the second embodiment are identical to those performed by the TFET according to the first embodiment.

In the TFET according to the second embodiment, the impurity concentration gradient between the source layer 95 and the channel region CH is steep, and that between the drain layer 70 and the channel region CH is gentle. Therefore, the second embodiment can also achieve effects identical to those of the first embodiment.

According to the manufacturing method of the second embodiment, the impurity concentration profiles of the source layer 95 and the drain layer 70 can be individually controlled by introducing the microwave annealing at the step of forming the diffusion layers of the TFET. Accordingly, the manufacturing method of the second embodiment can also achieve effects identical to those of the manufacturing method of the first embodiment.

According to the second embodiment, both the source layer 95 and the drain layer 70 are simultaneously and collectively formed by the microwave annealing. Therefore, in the second embodiment, it is unnecessary to perform high-temperature annealing such as the RTA method to form the source layer 95 and the drain layer 70. Accordingly, the manufacturing method of the second embodiment is much easier than that of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a gate dielectric film on a semiconductor substrate;
    forming a gate electrode on the gate dielectric film;
    introducing impurities of a first conduction type into a drain-layer formation region;
    amorphizing single crystals of the semiconductor substrate in a source-layer formation region by introducing inert impurities into the source-layer formation region;
    introducing impurities of a second conduction type into the source-layer formation region; and
    bringing at least an amorphous semiconductor in the source-layer formation region into a single crystal semiconductor and activating the impurities of the second conduction type in the source-layer formation region by irradiating the semiconductor substrate with microwaves.

2. The method of claim 1, further comprising activating the impurities of the first conduction type in the drain-layer formation region by performing heat treatment after introducing the impurities of the first conduction type into the drain-layer formation region, wherein
    the single crystals of the semiconductor substrate in the source-layer formation region are amorphized after activating the impurities of the first conduction type in the drain-layer formation region.

3. The method of claim 1, wherein the impurities of the first conduction type in the drain-layer formation region are deeper than the impurities of the second conduction type in the source-layer formation region.

4. The method of claim 2, wherein the impurities of the first conduction type in the drain-layer formation region are deeper than the impurities of the second conduction type in the source-layer formation region.

5. The method of claim 1, wherein the inert impurities are germanium, silicon, or a germanium-silicon compound ($Si_{1-x}Ge_x$ (where X=0 to 1)).

6. The method of claim 2, wherein the inert impurities are germanium, silicon, or a germanium-silicon compound ($Si_{1-x}Ge_x$ (where X=0 to 1)).

7. The method of claim 3, wherein the inert impurities are germanium, silicon, or a germanium-silicon compound ($Si_{1-x}Ge_x$ (where X=0 to 1)).

8. The method of claim 1, wherein the inert impurities are introduced deeper than the impurities of the second conduction type in the source-layer formation region.

9. The method of claim 2, wherein the inert impurities are introduced deeper than the impurities of the second conduction type in the source-layer formation region.

10. The method of claim 3, wherein the inert impurities are introduced deeper than the impurities of the second conduction type in the source-layer formation region.

11. The method of claim 1, wherein
the single crystals of the semiconductor substrate in the drain-layer formation region are amorphized by introducing the inert impurities into the drain-layer formation region before introducing the impurities of the first conduction type into the drain-layer formation region, and
the amorphous semiconductor in the source-layer formation region and an amorphous semiconductor in the drain-layer formation region are brought into single crystal semiconductors, and the impurities of the first conduction type in the drain-layer formation region and the impurities of the second conduction type in the source-layer formation region are activated, when the semiconductor substrate is irradiated with the microwaves.

12. The method of claim 11, wherein the inert impurities are introduced deeper in the source-layer formation region than in the drain-layer formation region.

13. The method of claim 11, wherein the drain-layer formation region is amorphized by implantation of the inert impurities more deeply than the source-layer formation region.

14. The method of claim 12, wherein the drain-layer formation region is amorphized by implantation, of the inert impurities more deeply than the source-layer formation region.

15. The method of Claim: 11, wherein: the inert impurities include germanium, silicon, or a germanium-silicon compound ($Si_{1-x}Ge_x$(where X=0 to 1)).

16. The method of claim 11, wherein
the inert Impurities are introduced deeper than the impurities of the first conduction type in the drain-layer formation region, and
the inert impurities are introduced deeper than the impurities of the second conduction type in the source-layer formation region.

17. The method of claim 12, wherein
the inert impurities are introduced deeper than the impurities of the first conduction type in the drain-layer formation region, and
the inert impurities are introduced deeper than the impurities of the second conduction type in the source-layer formation region.

18. The method of claim 13, wherein
the inert impurities are introduced deeper than the impurities of the first conduction type in the drain-layer formation region, and
the inert impurities are introduced deeper than the impurities of the second conduction type in the source-layer formation region.

* * * * *